(12) United States Patent
Chen et al.

(10) Patent No.: US 8,331,135 B2
(45) Date of Patent: Dec. 11, 2012

(54) SIGNAL CONTROL ELEMENTS IN FERROMAGNETIC LOGIC

(75) Inventors: An Chen, Sunnyvale, CA (US); Zoran Krivokapic, Santa Clara, CA (US)

(73) Assignee: Globalfoundries Inc., Grand Cayman (KY)

(*) Notice: Subject to any disclaimer, the term of this patent is extended or adjusted under 35 U.S.C. 154(b) by 364 days.

(21) Appl. No.: 12/644,980

(22) Filed: Dec. 22, 2009

(65) Prior Publication Data
US 2011/0147709 A1    Jun. 23, 2011

(51) Int. Cl.
*G11C 11/15* (2006.01)
*H03K 19/168* (2006.01)

(52) U.S. Cl. ............. 365/158; 365/171; 365/185.03; 257/24; 257/421; 257/427; 257/E29.245; 257/E21.521; 326/37

(58) Field of Classification Search .......... 365/158, 365/172, 173, 171, 185.03; 257/24, 421, 257/427, E29.245, E21.521; 438/14, 827; 326/37–40
See application file for complete search history.

(56) References Cited

U.S. PATENT DOCUMENTS

| | | | | |
|---|---|---|---|---|
| 5,629,549 A * | 5/1997 | Johnson | | 257/421 |
| 6,721,141 B1 * | 4/2004 | Attenborough et al. | | 360/324 |
| 6,774,391 B1 | 8/2004 | Cowburn | | |
| 7,209,381 B2 * | 4/2007 | Johnson | | 365/158 |
| 7,245,524 B2 * | 7/2007 | Yoda et al. | | 365/158 |
| 7,307,876 B2 * | 12/2007 | Kent et al. | | 365/171 |
| 7,569,902 B2 * | 8/2009 | Fujiwara et al. | | 257/421 |
| 7,911,832 B2 * | 3/2011 | Kent et al. | | 365/171 |
| 8,053,244 B2 * | 11/2011 | Ryan et al. | | 436/149 |
| 8,053,255 B2 * | 11/2011 | Gao et al. | | 438/14 |
| 8,054,677 B2 * | 11/2011 | Zhu | | 365/158 |

OTHER PUBLICATIONS

Csaba et al., "Nanocomputing by Field-Coupled Nanomagnets", IEEE Transactions on Nanotechnology, vol. 1, No. 4, Dec. 2002, pp. 1-5.
M. Niemier, X.S. Hu, A. Dingier, M.T. Alam, G. Bernstein, and W. Porod, "Bridging the Gap between Nanomagnetic Devices and Circuits", Proceedings of IEEE International Conference on Computer Design (ICCD), pp. 506-513 (2008).

\* cited by examiner

*Primary Examiner* — Vibol Tan
(74) *Attorney, Agent, or Firm* — Ditthavong Mori & Steiner, P.C.

(57) ABSTRACT

A chain of field coupled nanomagnets includes at least one elements having substantially different anisotropy energy from that of the other nanomagnets. A signal can propagate from a first input nanomagnet having a relatively high anisotropy energy through the chain to an output nanomagnet. The output nanomagnet may have a relatively lower anisotropy energy than the other nanomagnets. Signal flow direction thus can be controlled. The higher anisotropy energy nanomagnet may be attained by use of a ferromagnet material having a higher anisotropy constant and/or configured with a larger volume than the other elements. The lower anisotropy energy magnet may be attained by use of a ferromagnet material having a lower anisotropy constant and/or configured with a smaller volume than the other elements. Logic signal flow control can also be attained making use of three dimensional geometries of nanomagnets with two different orientations.

11 Claims, 9 Drawing Sheets

SIGNAL CONTROL ELEMENTS IN FERROMAGNETIC LOGIC

BACKGROUND

The present disclosure relates to nano-scale ferromagnets (nanomagnets), and more particularly to use of ferromagnet logic systems in sequential logic applications.

With CMOS scaling approaching fundamental limits, emerging logic devices based on novel state variables are considered promising candidates for beyond-CMOS computation solutions. So-called spintronic devices can be used to implement binary logic functionality. Magnetic anisotropy is a directional dependence of the magnetic properties of the magnet material. The magnetization direction of nanomagnets is the collective polarization direction of all the spins inside of the magnets. Rectangular or elliptical shaped nanomagnets have lower energy when the magnetization direction is along the long side of the magnet configuration than when the magnetization direction is along the short side. The magnetic material will align its magnetic moment to the lower energy long direction, commonly referred to as the "easy" axis. The higher energy direction, i.e., the short side, is referred to as the "hard" axis.

Figure 1A:
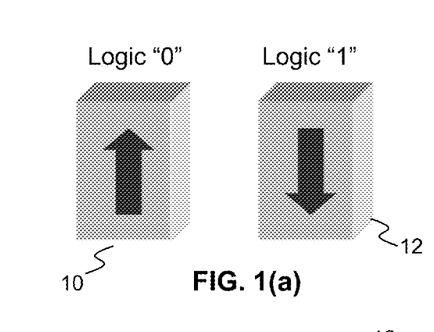

Logic information can be represented by the magnetization direction of ferromagnets 10 and 12, as shown in FIG. 1(a). In the illustrated rectangular configuration, the easy axes are in the vertical direction. The magnetization direction can be upwards, as shown by the arrow in magnet 10 or downwards, as shown by the arrow in magnet 12. The upward and downward directions are binary complements. The upward direction may be arbitrarily selected to represent a logic "0", the downward direction representing a logic "1". Energy applied to a magnet, such as by imposition of a magnetic field in the hard axis direction, can temporarily change the magnetization direction.

Figure 1B:
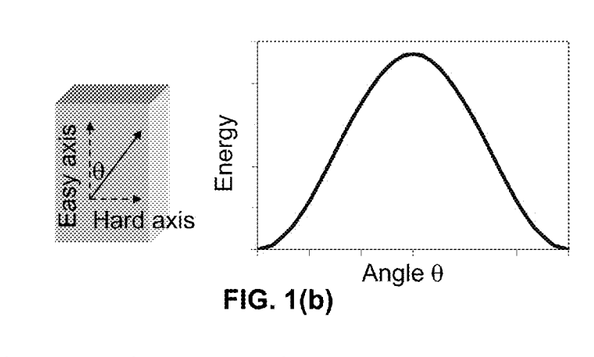

An energy barrier differentiates the two nonvolatile logic states, as illustrated in FIG. 1(b), wherein energy is plotted with respect to the angle of magnetization. The curve indicates an energy maximum, or barrier, at the hard axis angle. The energy difference is known as the shape anisotropy energy of the magnet, which is proportional to the anisotropy constant of the magnet material multiplied by the magnet volume. The logic state of the magnet can be "switched" by application of barrier energy in the hard axis direction to temporarily drive the magnetization direction toward the hard axis and applying a field that orients the magnetization in either (up or down) easy axis direction.

Figure 2:
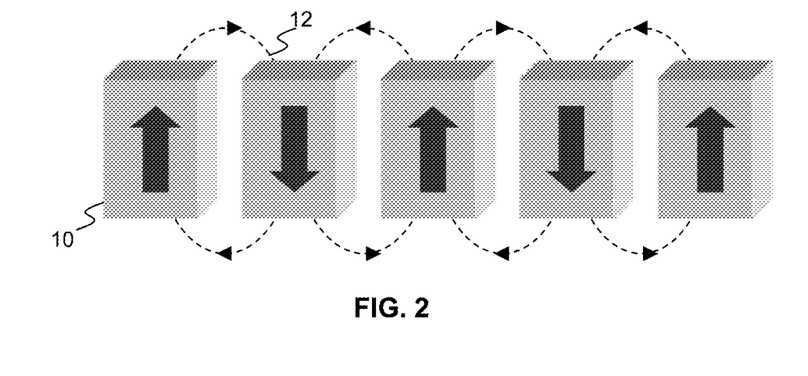
FIG. 2 is a diagram illustrative of a chain of nanomagnets antiferromagnetically coupled to each other.

Ferromagnet logic operation is reliant on the magnetic field coupling between neighboring nanomagnets. Magnets closely placed together interact with each other via the short-ranged magnetostatic dipole fields. The fringing magnetic field of one nanomagnet can affect the orientation of its neighboring nanomagnets. FIG. 2 shows a chain of nanomagnets antiferromagnetically coupled to each other. The dashed lines indicate the fringing magnetic fields of the magnets with the arrows pointing to the directions of the magnetic fields. Logic information encoded in the magnetization direction of each nanomagnet can propagate through the chain of nanomagnets.

Figure 3A:
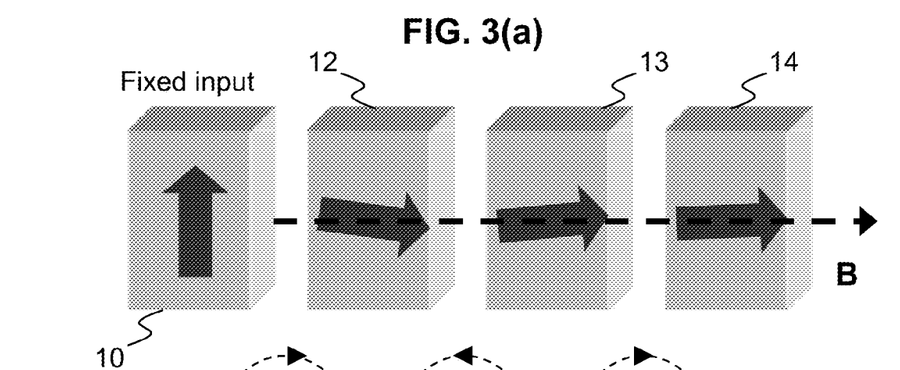
FIGS. 3(a)-3(c) are diagrams illustrative of nanomagnetic switching operation facilitated by application of an external clocking field.
Figure 3B:
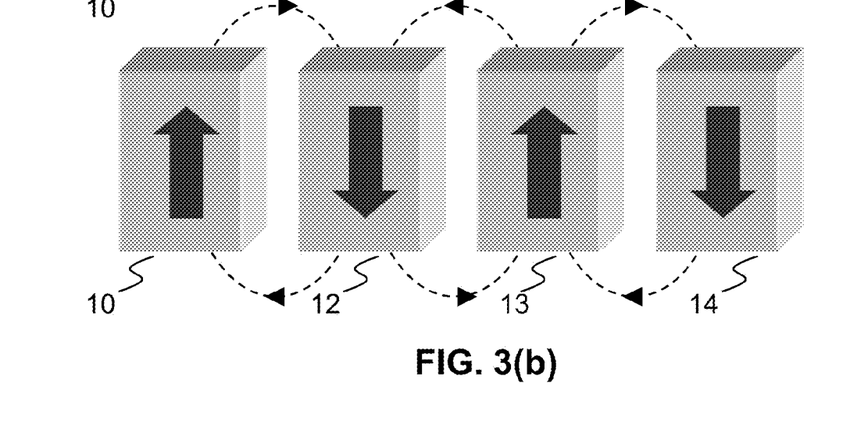
Figure 3C:
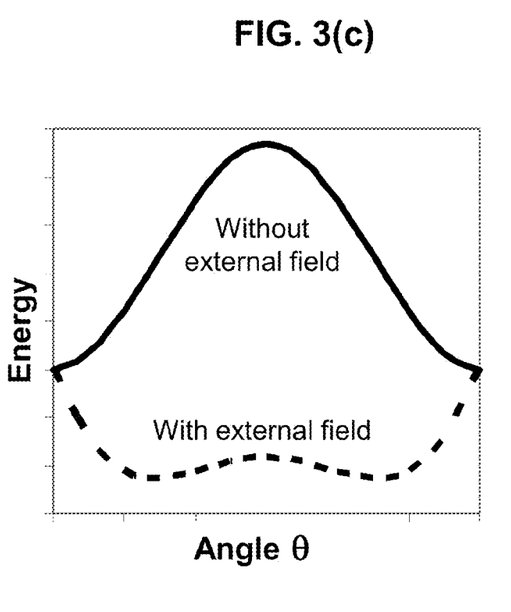

FIGS. 3(a-c) illustrate nanomagnetic switching operation facilitated by application of external field B. As shown in FIG. 3(a), a fixed input field is applied to input magnet 10 in a direction corresponding to the required logic state. A field B is applied along the hard axis direction. Field B is of sufficient magnitude to deflect the magnetization directions of magnets 12-14 in the hard axis direction of the applied field. FIG. 3(c) is a plot representing the energy landscapes of the magnets with and without the applied external field. The energy barrier between the two logic states is lowered by field B, thereby making logic transition easier. As the magnetization of the nanomagnets is unstable in this direction, when the external field B is removed the easy axis magnetization directions of the nanomagnets will be decided by the fringe field of the input nanomagnet 10.

FIG. 3(b) illustrates the magnetization directions of magnets 10-14 after removal of the clocking and fixed input fields. Removal of the clocking field effects deflection of the magnetic polarization directions of the magnets from the hard axis horizontal direction to the easy axis vertical direction. As, in this example, the fixed input applied to magnet 10 causes an upward deflection of magnetization direction, or a logic 0, the coupling between the successive neighboring magnets 12-14, effects alternate magnetization directions along the chain of magnets. Since there is an even number of magnets, the magnetization direction of magnet 14 is downward, corresponding to a logic 1. If magnet 14 is sensed as an output, the illustrated chain of magnets functions as a logic inverter.

Although each nanomagnet is a nonvolatile element that can store information, the magnets can each be disturbed by noise/error and external fields. The length of a magnet chain along which magnetization information can propagate without error is limited. As a logic signal can propagate in the forward or backward direction in a chain of nanomagnets, direction control is a significant challenge. In order to implement sequential logic, a logic signal needs to be stored in each logic operation stage and retrieved in the next operation stage. The need thus exists for improved signal control and synchronization control in ferromagnet logic systems. To advance this need, special elements should be developed for insertion in ferromagnet logic systems to control signal flow and store logic information.

DISCLOSURE

The above described needs are fulfilled, at least in part, by a chain of field coupled nanomagnets with at least one of the nanomagnet elements having substantially different anisotropy energy from the anisotropy energy attributes of the other nanomagnets. A signal can propagate from a first input nanomagnet having a relatively high anisotropy energy through the chain to an output nanomagnet. The output nanomagnet may have a relatively lower anisotropy energy than the other nanomagnets. The input nanomagnet is thus operative as a signal source and the output nanomagnet is operative as a signal sink to support successful signal propagation in a forward direction. The higher anisotropy energy nanomagnet may be attained by use of a ferromagnet material having a higher anisotropy constant and/or configured with a larger volume than the other elements. The lower anisotropy energy magnet may be attained by use of a ferromagnet material having a lower anisotropy constant and/or configured with a smaller volume than the other elements.

The nanomagnets may be separated into a plurality of groups for staged logic system operation. For example, first and second groups may be formed in adjacent layers, the output nanomagnet of the first group and the input nanomagnet of the second group coupled by magnetic field. A clocking field can be applied to a respective group in alternate stages of operation to propagate logic signals. One or more of the groups may include a plurality of input nanomagnets coupled to an element in the chain to provide a logic function.

In another example, first and second groups may be positionally configured with the hard magnetization axes of the first nanomagnet group being parallel to each other but orthogonal to the hard axes of the second nanomagnet group. Staged operation can be implemented by alternate application of a clocking field in the direction of the hard axis of each respective group in succession. One or more of the groups may include a plurality of input nanomagnets coupled to an element in the chain to provide a logic function.

Additional advantages of the present disclosure will become readily apparent to those skilled in this art from the following detailed description, wherein only preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawing and in which like reference numerals refer to similar elements and in which.

FIGS. (1a) and 1(b) are diagrams illustrative of ferromagnet logic states and ferromagnet magnetization energy landscape, respectively.

DETAILED DESCRIPTION

Nanomagnets made of different materials have different properties. For example, the following table shows different parameters (e.g., anisotropy energy constant) of different metallic ferromagnetic materials.

|  | TC(K) | Easy axis | Saturation Mag. (Ms) | Anisotropy (Ku) |
|---|---|---|---|---|
| Fe (bcc) | 1043 | [100] | $1.74 \times 10^6$ A/m | $5.42 \times 10^4$ J/m3 |
| Co (hcp) | 1388 | c-axis | $1.47 \times 10^6$ A/m | $7.71 \times 10^5$ J/m3 |
| Ni (fcc) | 631 | [111] | $1.26 \times 10^5$ A/m | $1.26 \times 10^5$ J/m3 |

It is also possible to modulate the key material parameters by doping semiconductors and oxides differently with ferromagnetic species (e.g., Mn).

Figure 4A:
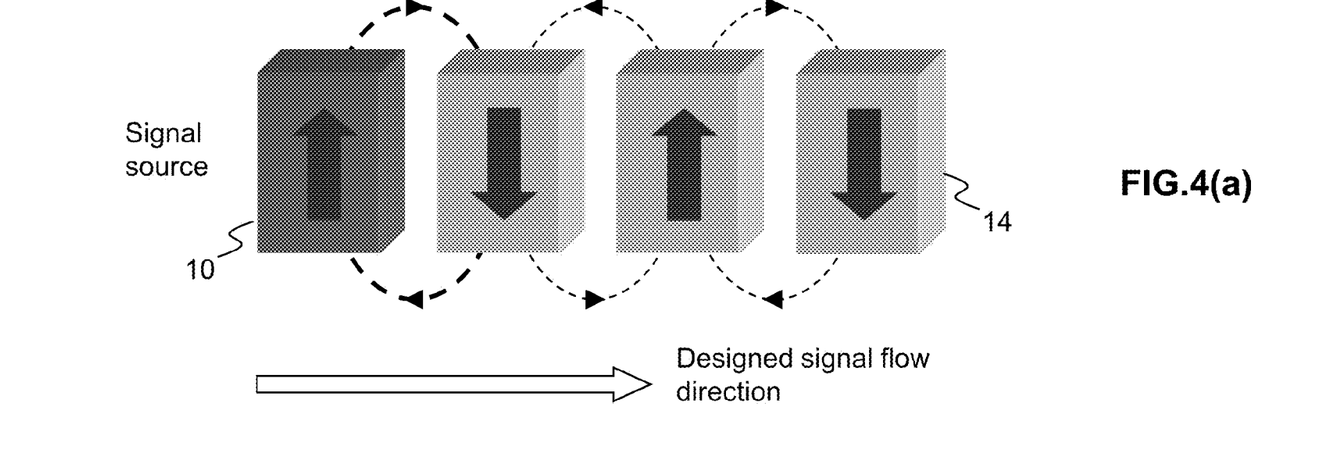
FIGS. 4(a) and 4(b) are diagrams of nanomagnet chains wherein one of the nanomagnets is of different anisotropy energy than that of the other nanomagnets.
Figure 4B:
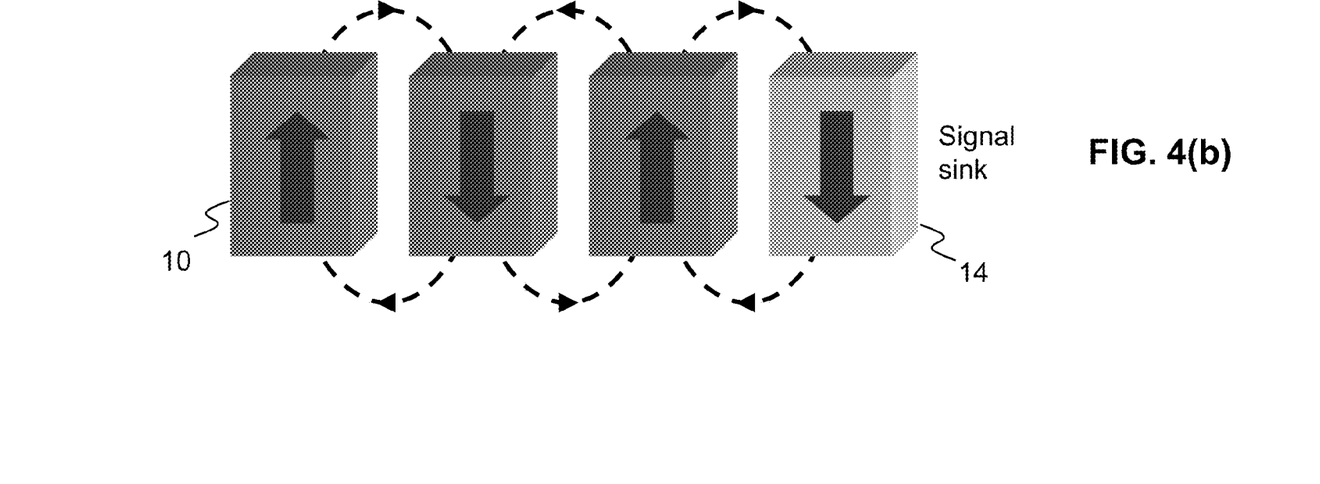

Anisotropy energy determines how hard it is to switch a nanomagnet. Nanomagnets made of different materials can be inserted in a ferromagnet logic system. As shown in FIG. 4(a), nanomagnet 10 has a higher anisotropy constant, as indicated by a darker tone, than the other nanomagnets in the chain. In FIG. 4(b), nanomagnet 14 has a lower anisotropy constant, as indicated by a lighter tone, than the other magnets in the chain. Since nanomagnet 10 is harder to switch than the other magnets and nanomagnet 14 is easier to switch than the other nanomagnets, insertion of these magnets at the shown positions in the chain can be used to control signal flow direction and to store logic information. The higher anisotropy constant of nanomagnet 10 exerts a stronger fringing field on its neighbor and is harder to be switched, thereby serving as a signal source. The lower anisotropy constant of nanomagnet 14 exerts a weaker fringing field on its neighbor and is easier to be switched, thus serving a signal sink.

Figure 5A:
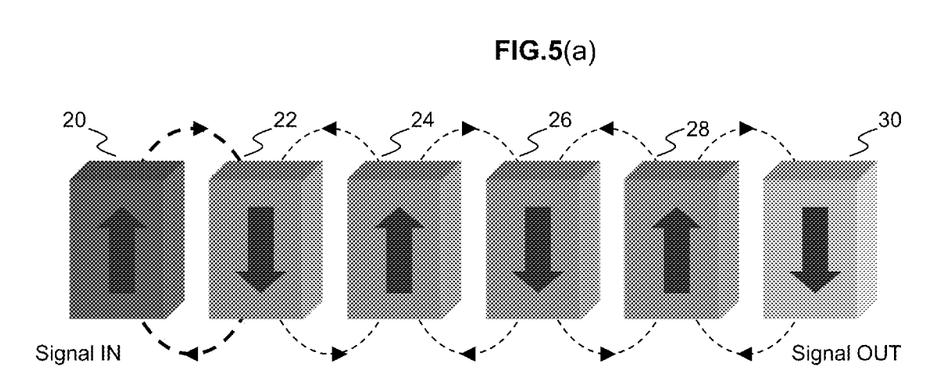
FIGS. 5(a) and 5(b) are diagrams illustrative of control of signal flow direction for nanomagnet arrangements such as illustrated in FIGS. 4(a) and 4(b)
Figure 5B:
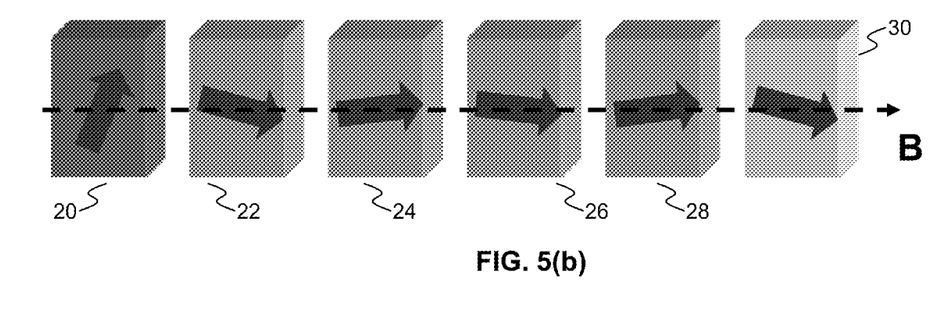

A chain of nanomagnets with controllable signal flow direction is obtained by combining these concepts, as illustrated in FIGS. 5(a) and 5(b). Nanomagnet 20, of relatively higher anisotropy constant than that of nanomagnets 22-30, is at the left most position in the chain. Nanomagnet 30, of relatively lower anisotropy constant than that of nanomagnets 20-28, is at the right most position in the chain. A logic signal is easier to propagate from left to right than from right to left. Signal back flow is unlikely because nanomagnet 20 has a strong force to drive the signal to its right side, while nanomagnet 30 has a weak force to reflect the signal back to its left side. As shown in FIG. 5(a), the magnetization direction of nanomagnet 20 is in the upward direction, representing a logic 0. As there are six elements in the chain, the magnetization direction of nanomagnet 30 is downward, representing a logic 1. This configuration functions as an inverter.

FIG. 5(b) depicts application in the hard axis direction of a magnetic field B that is strong enough to disturb the magnetization directions of nanomagnets 22-30. Magnetic field B can be generated by application of current to a conductive wire positioned with respect to affect each of the nanomagnets 20-30. The magnetic field B, however, is not of sufficient strength to reach the barrier energy level of magnet 20, as influenced by the higher anisotropy constant. As the state of nanomagnet 20 is unchanged, application of field B will not have affected a change in logic information stored by the chain when application of field B is removed. The magnetization directions of nanomagnets 20-30 return to the directions illustrated in FIG. 5(a).

The logic states of nanomagnets 20-30 can be determined by an input signal applied to nanomagnet 20 if a clocking magnetic field pulse B is applied at sufficient strength to meet the barrier energy of nanomagnet 20. During this time, the magnetization directions of all nanomagnets 20-30 are in the hard axis direction. A fixed input signal, in the form of a magnetic field, is applied to nanomagnet 20 in the easy axis direction. This input is attained by application of current to a conductive wire positioned appropriately in relation to the nanomagnet 20. Upon removal of the clocking pulse, the magnetization direction of nanomagnet 20 will correspond to the direction of the imposed input magnetic field. If the input field is directed in a downward direction, the magnetization direction of nanomagnet 20 will be switched and thus also the remaining nanomagnets 22-30. The logic state of the output nanomagnet 30 thus will be switched from a logic 1 to a logic 0.

Figure 6:
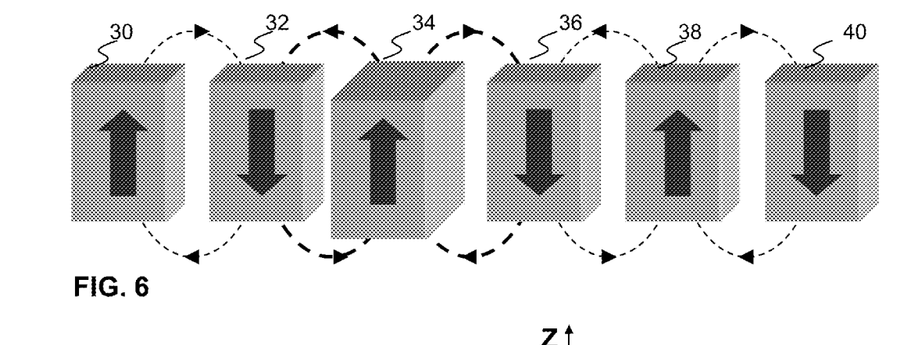
FIG. 6 is a diagram of a nanomagnet chain wherein one element thereof has a larger volume configuration.

Anisotropy energy depends on not only the anisotropy constant, but also the volume of the nanomagnet. Thus, control elements such as input nanomagnet 20 and output nanomagnet 30 can, instead, be formed of the same material but of respectively higher and lower volume. FIG. 6 illustrates a chain of nanomagnets 30 40, each made of material having the same or similar ferromagnetic properties. Nanomagnets 30, 32, and 36-40 are of substantially the same volume. Nanomagnet 34 is of substantially larger volume, and thus of higher barrier energy, than that of the other nanomagnets. The heavier dashed lines between nanomagnet 34 and its neighbors 32 and 36 indicate that the fringing magnetic fields of these magnets are more heavily influenced than the fields between other neighboring nanomagnet pairs in the chain. The logic states of the nanomagnets will not be affected by application in the hard axis direction of a magnetic field B that is strong enough to disturb the magnetization directions of nanomagnets 30, 32, and 36-40 but not of sufficient strength to reach the barrier energy level of magnet 34.

The logic operation described above with respect to FIGS. 5(a) and 5(b) can be obtained constructing nanomagnet 20 of higher volume than that of nanomagnets 22-30 and constructing nanomagnet 30 of lower volume than that of nanomagnets 20-28. In this case, all nanomagnets 20-30 may be of the same or different material, as long as nanomagnet 20 is attributed with a higher anisotropy energy and nanomagnet 30 is attributed with a lower anisotropy energy than nanomagnets 22-28.

Figure 7A:
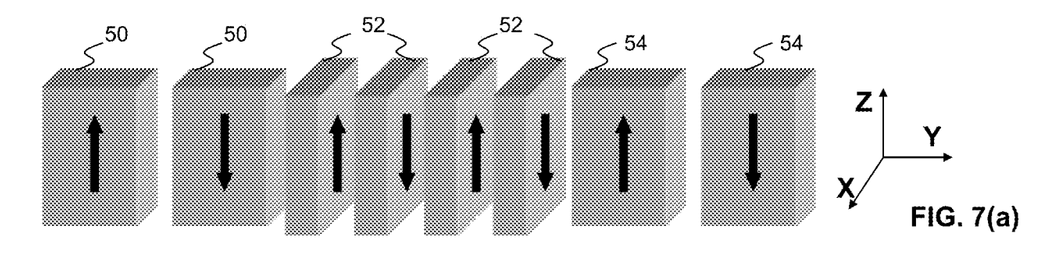
FIG. 7(a) is a diagram of a nanomagnet chain wherein groups of nanomagnets are respectively positioned three-dimensionally with their respective hard axes orthogonal to each other.
Figure 7B:
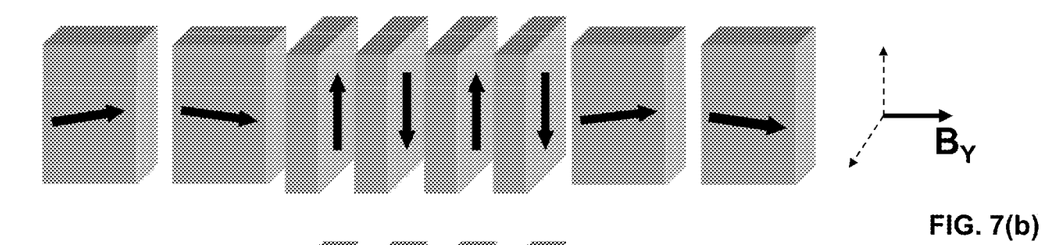
FIGS. 7(b) and 7(c) are diagrams illustrative of nanomagnetic switching operation facilitated by alternate application of external clocking fields to the nanomagnets shown in FIG. 7(a)
Figure 7C:
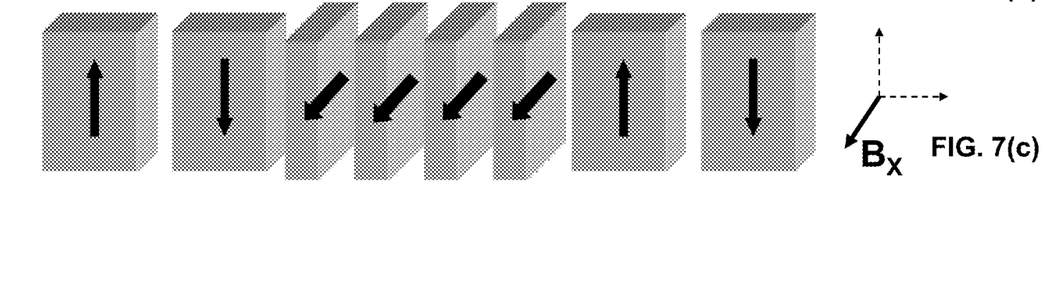

Logic signal flow control can also be attained making use of three dimensional geometries of nanomagnets with two different orientations, such as illustrated in FIGS. 7(a)-7(c). Nanomagnets 50, 52 and 54 are of substantially the same ferromagnetic properties and volume configurations. Each of the elements is configured three dimensionally with a length dimension defining an easy magnetization axis direction, a width dimension defining a hard magnetization axis direction, and a depth dimension defining a superhard magnetization axis direction, the easy magnetization axis direction, the hard magnetization axis direction and the superhard magnetization axis direction being orthogonal to each other. The easy axes of all nanomagnets are in parallel. The three dimensional coordinate system is represented by the X, Y, Z arrows. The Y-Z surfaces of nanomagnets 50 and 54 define "easy planes" for these nanomagnets. The X-Z surfaces of nanomagnets 52 define "easy planes" for these nanomagnets. FIG. 7(a) depicts magnetization directions when no field is applied. Each nanomagnet is of opposite polarity in the vertical, easy, direction to its neighbor.

In FIG. 7(b), a magnetic field $B_Y$ of a strength that meets the hard axis barrier energy level of the nanomagnets is applied in the Y direction to all nanomagnets. The magnetization directions of nanomagnets 50 and 54 are disturbed, as the field is applied in the hard axis direction of their easy planes. The magnetization directions of nanomagnets 52 are not disturbed as the applied field direction is orthogonal to the hard axis direction of their easy planes. With respect to nanomagnets 52, the field is applied in their depth direction, i.e., their superhard axes. As the depth direction is substantially smaller than the width direction of the hard axis, a substantially higher field than $B_Y$ is required to meet the barrier energy level for nanomagnets 52.

In FIG. 7(c), a magnetic field $B_X$ of a strength that meets the hard axis barrier energy level of the nanomagnets is applied in the X direction to all nanomagnets. The magnetization directions of nanomagnets 52 are disturbed, as the field is applied in the hard axis direction of their easy planes. The magnetization directions of nanomagnets 50 and 54 are not disturbed as the applied field direction is orthogonal to the hard axis direction of their easy planes. With respect to nanomagnets 50 and 54, the field is applied in their depth direction, i.e., their superhard axes. As the depth direction is substantially smaller than the width direction of the hard axis, a substantially higher field than $B_X$ is required to meet the superhard axis barrier energy level for nanomagnets 50 and 54.

Use of three dimensional nanomagnet geometries, such as described above, permits segmentation of a ferromagnet logic system into stages for sequential logic operation, analogous to CMOS circuits. Large-scale ferromagnet logic can be made controllable by dividing it into stages. Alternating external magnetic fields, applied in directions orthogonal to each other, can drive the operation of the different stages. In each stage, logic information can be stored in the stages that are not disturbed by the external field.

Figure 8A:
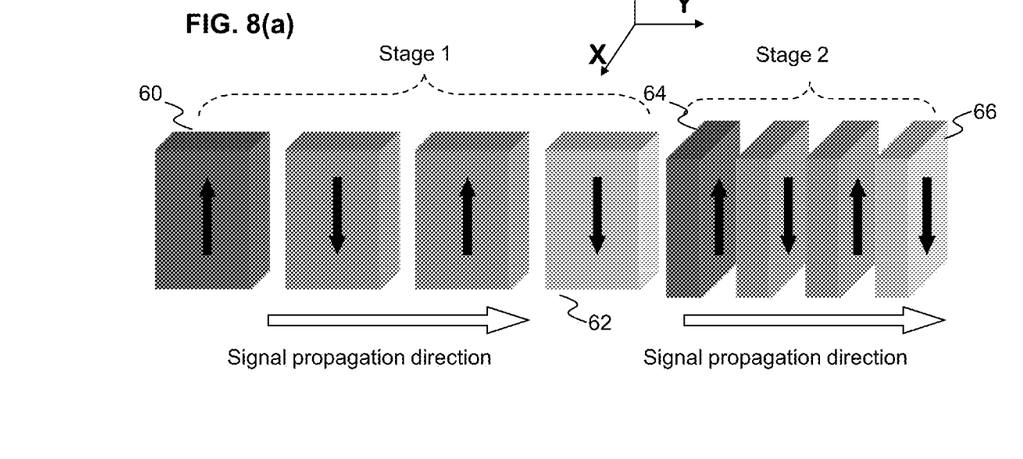
FIGS. 8(a) and 8(b) are diagrams of a nanomagnet chain such as shown in FIG. 7(a) and illustrative of signal propagation by successive stage operation.
Figure 8B:
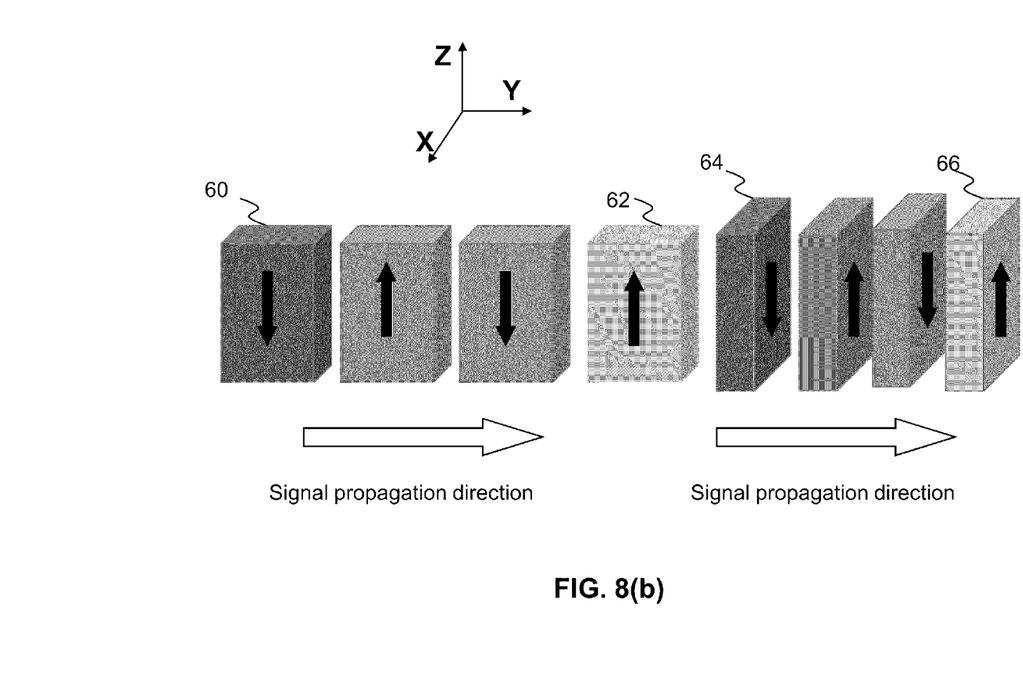

Two-stage operation is exemplified by FIGS. 8(a) and 8(b), stage 1 includes four magnets with Z-Y easy plane surfaces. For signal propagation directed from left to right, nanomagnet 60 is of higher anisotropy energy and nanomagnet 62 is of lower anisotropy energy than the nanomagnets therebetween. Stage 2 includes four magnets with X-Z easy plane surfaces. For signal propagation directed from left to right, nanomagnet 64 is of higher anisotropy energy and nanomagnet 66 is of lower anisotropy energy than the nanomagnets therebetween. Although the nanomagnets of differing anisotropy energy are represented by materials having different anisotropy constants, alternatively, the nanomagnets of different anisotropy energy may be formed in different volume configurations, with or without a change in material.

The easy axes of all nanomagnets are in parallel and positioned sufficiently close to each other to be influenced by the fringe magnetic fields of their neighbors. The magnetization directions of the nanomagnets alternate in polarity as shown in their initial state in FIG. 8(a). As there are an even number of nanomagnets in stage 1, this configuration functions as an inverter. Stage 1 input nanomagnet 60, having an upward polarity represents a logic 0. Stage 1 output nanomagnet 62 represents a logic 1. Stage 2 also functions as an inverter. Stage 2 input nanomagnet 64 represents a logic 0. Stage 2 output nanomagnet 66 represents a logic 1.

In pipelined logic operation, a clocking magnetic field $B_Y$ is first applied in the Y direction to all nanomagnets. The magnetization directions of all nanomagnets of stage 1 are disturbed, as the field is applied in the hard axis direction of their easy planes. The magnetization directions of the nanomagnets of stage 2 are not disturbed as the applied field direction is orthogonal to the hard axis direction of their easy planes. A fixed input signal is applied in the Z direction to nanomagnet 60. Stage 1 operation ends with the cessation of magnetic field $B_Y$. If the fixed input signal is of logic 0 polarity, nanomagnet 60 will retain its polarity state as shown in FIG. 8(a) and thus the other stage 1 nanomagnets will retain their illustrated polarity states.

Stage 2 operation then commences with application of a clocking magnetic field $B_X$ is first applied in the X direction to all nanomagnets. The magnetization directions of all nanomagnets of stage 2 are disturbed, as the field is applied in the hard axis direction of their easy planes. The magnetization directions of the nanomagnets of stage 1 are not disturbed as the applied field direction is orthogonal to the hard axis direction of their easy planes. Stage 2 operation ends with the cessation of magnetic field $B_X$. AS stage 1 output nanomagnet 62 has maintained its logic 1 state, the magnetization direction of nanomagnet 64 will return to the easy axis vertical direction in its original 0 logic state polarity. The logic states of all the nanomagnets will retain the polarities shown in FIG. 8(*a*).

FIG. 8(*b*) illustrates two stage operation wherein a fixed input signal of logic 1 polarity is applied to input nanomagnet 60 and is propagated through both stages. In stage 1, application of the clocking magnetic field $B_Y$ disturbs the magnetization directions of all stage 1 nanomagnets as the field is applied in the hard axis direction of their easy planes. Upon removal of magnetic field $B_Y$, the magnetization direction of nanomagnet 60 will assume an easy axis vertical alignment in a direction driven by the applied input signal. The logic 1 polarity is thus attained by nanomagnet 60, as shown in FIG. 8(*b*). The remaining stage 1 nanomagnets change polarities in accordance with the input signal. Stage 1 output nanomagnet 62 attains a logic 0 polarity state. Stage 1 operation has thus performed a logic switching function.

In stage 2, application of the clocking magnetic field $B_X$ disturbs the magnetization directions of all stage 2 nanomagnets as the field is applied in the hard axis direction of their easy planes. Upon removal of magnetic field $B_X$, the magnetization direction of nanomagnet 64 will assume an easy axis vertical alignment in a direction driven by the logic 0 state of stage 1 output nanomagnet 62. The logic 1 polarity is thus attained by nanomagnet 64 and is inverted at the stage 2 output nanomagnet 66. The logic switching function thus has been propagated to stage 2.

Figure 9:
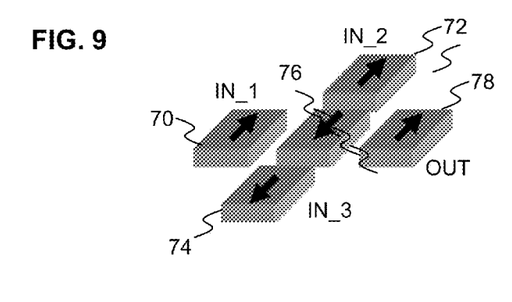
FIG. 9 is a diagram of a nanomagnet configuration that is operable as a majority logic gate.

Each stage of operation of the arrangement illustrated in FIG. 8 functions as inverter, as the output nanomagnet is of opposite polarity from the polarity of its respective input nanomagnet. FIG. 9 illustrates an arrangement of nanomagnets that can be operated to provide AND and OR logic functions. Nanomagnets 70-72 have rectangular surfaces in the same easy plane. The fringing field of nanomagnet 76 is coupled to the fringing fields of nanomagnets 70, 72, 74 and 78. In operation, each of nanomagnets 70, 72 and 74 has applied thereto an input signal, indicated respectively as IN_1, IN_2 and IN_3. The polarity of nanomagnet 78 is sensed as an output of the device. As nanomagnet 76 is influenced by all of the input nanomagnets 70, 72 and 74, its polarity represents the plurality of the logic states of the input nanomagnets. The device is thus called a "majority gate." A logic table is as follows:

| IN_1 | IN_2 | IN_3 | OUT |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

As indicated by this table, if IN_1, for example, is maintained at a logic 0, the device operates as an AND gate for inputs IN_2 and IN_3. That is, a logic 1 output is obtained only if both inputs IN_2 and IN_3 are logic 1. If IN_1 is maintained at logic 1, the device operates as an OR gate for inputs IN_2 and IN_3. A logic 1 output is obtained if either of inputs IN_2 or IN_3 is logic 1.

Figure 10:
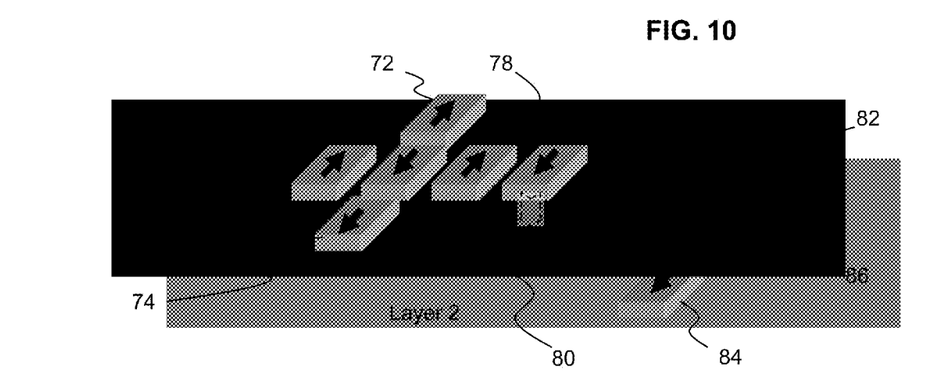
FIG. 10 is a diagram of nanomagnet arrangement comprising a plurality of nanomagnets formed in each of a plurality of layers.

FIG. 10 illustrates an arrangement of nanomagnets that can provide for two stage logic pipelined operation having a majority gate arrangement in each stage. The first stage includes nanomagnets formed in a first layer. The second stage includes nanomagnets formed in a second layer parallel to, and below, the first layer. The majority gate of the first layer comprises input nanomagnets 70, 72 and 74, and stage 1 output nanomagnet 78. The majority gate of the second layer includes stage 2 input nanomagnet 80, input nanomagnets 82 and 84, and stage output nanomagnet 86. Stage 1 output nanomagnet 78 is position directly above stage 2 input nanomagnet 80. In stage 1 operation, a clocking field B is applied to all nanomagnets of stage 1. The clocking field B is not of sufficient strength to affect the more remotely positioned nanomagnets of the second layer. Output nanomagnet 78 will have a logic state dependent upon the polarities of the three input nanomagnets of stage 1. In stage 2 operation, a clocking field B is applied to all nanomagnets of stage 2. The clocking field B is not of sufficient strength to affect the more remotely positioned nanomagnets of the first layer. Input magnet 80 will have a polarity opposite to that of stage I output nanomagnet 78. Output nanomagnet 86 will have a logic state dependent upon input nanomagnet 80 and input nanomagnets 82 and 84.

Figure 11:
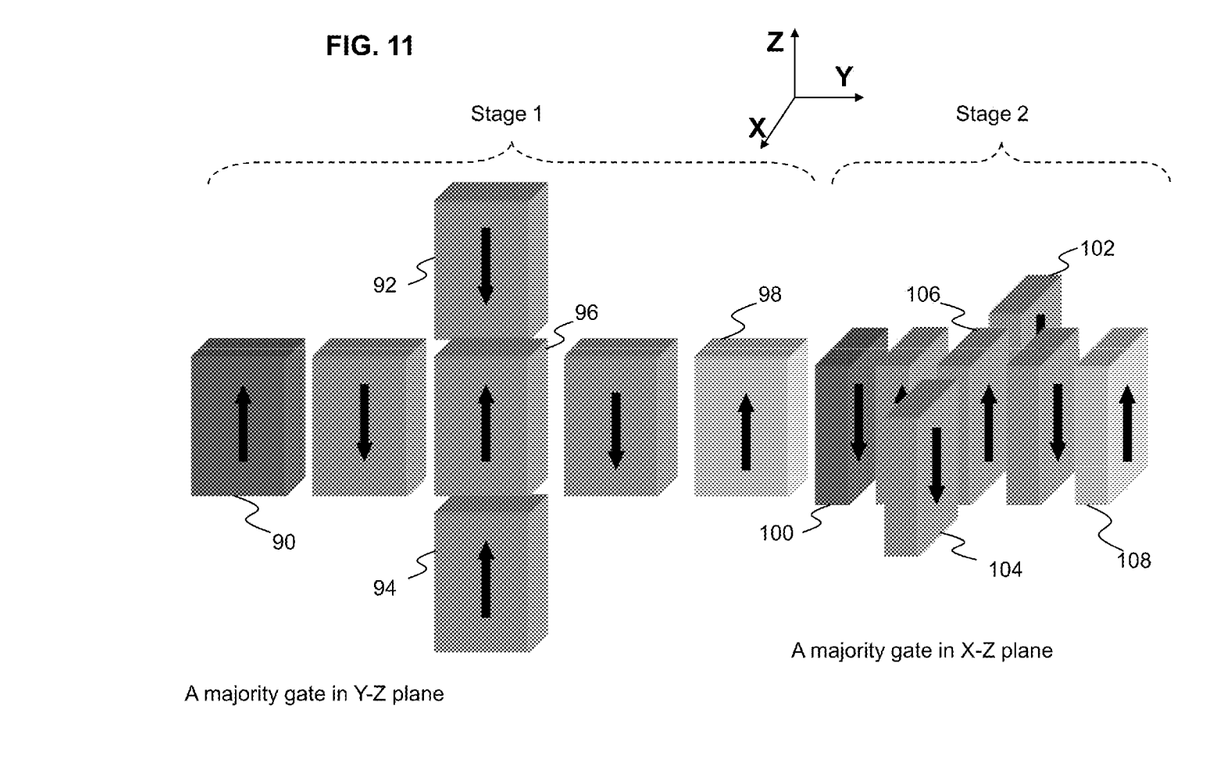
FIG. 11 is a diagram of a nanomagnet arrangement for successive stage operation with different three-dimensional configurations.

FIG. 11 is a diagram of a nanomagnet arrangement for successive stage operation with different three-dimensional configurations. Stage 1 comprises input nanomgnets 90, 92, and 94 and output nanomagnet 98. Signal source nanomagnet 90 has higher anisotropy energy and signal sink nanomagnet 98 has lower anisotropy energy than the other stage 1 nanomagnets. Stage 1 functions as a majority logic gate, the magnetization polarity of nanomagnet 96, being dependent upon the states of input nanomgnets 90, 92, and 94 as shown. Output nanomagnet 98 attains the same zero logic state as nanomagnet 96.

Stage 2 comprises input nanomgnets 100, 102, and 104 and output nanomagnet 108. Signal source nanomagnet 100 has higher anisotropy energy and signal sink nanomagnet 108 has lower anisotropy energy than the other stage 2 nanomagnets. Stage 2 also functions as a majority logic gate, the magnetization polarity of nanomagnet 106, being dependent upon the states of input nanomgnets 100, 102, and 104 as shown. Output nanomagnet 108 attains the same zero logic state as nanomagnet 100.

In each stage of operation, input signals different from those illustrated can be applied to the multiple input nanomagnets. The logic states of the stage outputs are determined accordingly. An inverted output can be obtained by insertion of an additional nanomagnet directly upstream of the output nanomagnet of the respective stage.

In this disclosure there are shown and described only preferred embodiments of the invention and a few examples of its versatility. It is to be understood that the invention is capable of use in various other combinations and environments and is capable of changes or modifications within the scope of the inventive concept as expressed herein. For example, the concepts of the present disclosure are applicable to various other nanomagnet configurations that have definable easy and hard axes, including those with various elliptical shapes

What is claimed is:

1. A magnetic device comprising:
   a plurality of elements of magnetically anisotropic material, neighboring elements of the plurality coupled to each other by a magnetic field;

wherein the device is configured to propagate a magnetic signal in a direction from a first element to which an input signal is applied to a last element of the plurality; and one of the elements is of substantially different anisotropy energy from the anisotropy energy attributes of other elements of the plurality;

wherein one of the elements is of substantially different anisotropy energy from the anisotropy energy attributes of other elements of the plurality; and wherein the plurality of elements are formed in a first layer, and further comprising:

a second plurality of elements of magnetically anisotropic material, the second plurality of elements formed in a second layer displaced from the first layer, neighboring elements of the second plurality coupled to each other by a magnetic field;

wherein one of the elements of the first layer and one of the elements of the second layer are coupled by a magnetic field.

2. A magnetic device as recited in claim 1, wherein said one of the elements of the second layer is operable as an input for receiving the magnetic signal propagated in the succession of first plurality of elements, whereby the signal may be further propagated to the elements of the second layer.

3. A magnetic device comprising:

a plurality of elements of magnetically anisotropic material, neighboring elements of the plurality coupled to each other by a magnetic field;

wherein the device is configured to propagate a magnetic signal in a direction from a first element to which an input signal is applied to a last element of the plurality; and one of the elements is of substantially different anisotropy energy from the anisotropy energy attributes of other elements of the plurality;

wherein one of the elements is of substantially different anisotropy energy from the anisotropy energy attributes of other elements of the plurality; and wherein a second element of the plurality is magnetically coupled to at least two other elements of the plurality; and wherein the at least two other elements are operable as inputs to the second element;

whereby the magnet device performs a logic function.

4. A magnetic device as recited in claim 3, wherein said second element is magnetically coupled to said first element as well as said at least two other elements, wherein the device is operable as a majority logic gate.

5. A magnetic device comprising:

a plurality of elements of magnetically anisotropic material, neighboring elements of the plurality coupled to each other by a magnetic field, each of the elements configured three dimensionally with a length dimension defining an easy magnetization axis direction, a width dimension defining a hard magnetization axis direction, and a depth dimension defining a superhard magnetization axis direction, the easy magnetization axis direction, the hard magnetization axis direction and the superhard magnetization axis direction being orthogonal to each other; and the easy magnetization direction axes of all of the plurality of elements are in parallel;

wherein at least one of the elements is oriented with its hard magnetization axis aligned in a first direction and other of the elements are oriented with the hard magnetization axes aligned in a second direction orthogonal to the first direction, and wherein the device is configured to propagate a magnetic signal from a first element of the plurality that is coupled to an input signal to a last element in the plurality.

6. A magnetic device as recited in claim 5, wherein the plurality of elements are divided into a first group of elements each having a hard magnetization axis oriented in the first direction and a second group of elements each having a hard magnetization axis oriented in the second direction.

7. A magnetic device as recited in claim 6, wherein the first group of elements is responsive in a first stage of operation to application of a magnetic field applied in the direction of the hard magnetization axes of the first group and the second group of elements is responsive in a second stage of operation to application of a magnetic field applied in the direction of the hard magnetization axes of the second group.

8. A magnetic device as recited in claim 7, wherein a first element of each group is of substantially higher anisotropy energy than anisotropy energy attributes of the other elements of the respective groups, and a last element of each group is of substantially lower anisotropy energy than the anisotropy attributes of the respective groups, and the last element of the first group is magnetically coupled to the first element of the second group;

whereby each first element is operable as a signal source and each last element is operable as a signal sink.

9. A magnetic device as recited in claim 8, wherein a second element of the first group is magnetically coupled to the first element of the first group and to at least two other elements of the first group; and wherein the first group is operable as a majority logic gate.

10. A magnetic device as recited in claim 9, wherein a second element of the second group is magnetically coupled to the first element of the second group and to at least two other elements of the second group; and wherein the second group is operable as a majority logic gate.

11. A magnetic device as recited in claim 5, wherein the plurality of elements comprise nanomagnets.

* * * * *